United States Patent
Salih

(10) Patent No.: US 11,018,023 B2
(45) Date of Patent: May 25, 2021

(54) DEFECT REDUCTION OF SEMICONDUCTOR LAYERS AND SEMICONDUCTOR DEVICES BY ANNEAL AND RELATED METHODS

(71) Applicant: SEMICONDUCTOR COMPONENTS INDUSTRIES, LLC, Phoenix, AZ (US)

(72) Inventor: Ali Salih, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/388,361

(22) Filed: Apr. 18, 2019

(65) Prior Publication Data

US 2020/0161142 A1 May 21, 2020

Related U.S. Application Data

(60) Provisional application No. 62/770,266, filed on Nov. 21, 2018.

(51) Int. Cl.
| | |
|---|---|
| *H01L 29/786* | (2006.01) |
| *H01L 21/324* | (2006.01) |
| *H01L 21/322* | (2006.01) |
| *H01L 21/02* | (2006.01) |
| *H01L 29/20* | (2006.01) |
| *H01L 29/66* | (2006.01) |
| *H01L 29/788* | (2006.01) |

(52) U.S. Cl.
CPC ...... *H01L 21/3245* (2013.01); *H01L 21/0254* (2013.01); *H01L 21/02381* (2013.01); *H01L 21/02675* (2013.01); *H01L 21/3228* (2013.01); *H01L 29/2003* (2013.01); *H01L 29/66742* (2013.01); *H01L 29/7886* (2013.01); *H01L 29/78681* (2013.01); *H01L 21/3221* (2013.01)

(58) Field of Classification Search
CPC ................................................ H01L 29/7606
See application file for complete search history.

(56) References Cited

U.S. PATENT DOCUMENTS

2010/0320505 A1* 12/2010 Okamoto .......... H01L 29/41766
257/192

OTHER PUBLICATIONS

Ha, M. "Annealing Effects on AlGaN/GaN HEMTs Employing Excimer Laser Pulses" Elec. and Sol. Sta. Lett. 8 (12) Sep. 13, 2005 pp. G352-G354 (Year: 2005).*
Shih, H-Y "Ultralow threading dislocation density in GaN epilayer on near-strain-free GaN compliant buffer layer and its applications in hetero-epitaxial LEDs" Scientific Reports 5 Sep. 2, 2015 pp. 1-11 with attached supplemental information attachment (Year: 2015).*

* cited by examiner

Primary Examiner — Grant S Withers
(74) Attorney, Agent, or Firm — Chamberlain Hrdlicka

(57) ABSTRACT

Systems and methods of the disclosed embodiments include reducing defects in a semiconductor layer. The defects may be reduced by forming the semiconductor layer on a substrate, removing at least a portion the substrate from an underside of the semiconductor layer, and annealing the semiconductor layer to reduce the defects in the layer. The annealing includes focusing energy at the layer.

8 Claims, 5 Drawing Sheets

DEFECT REDUCTION OF SEMICONDUCTOR LAYERS AND SEMICONDUCTOR DEVICES BY ANNEAL AND RELATED METHODS

BACKGROUND

Semiconductor devices typically use a few types of materials to create the transistor switches in the circuits of the device. A common material is silicon and techniques have been improved for the purifying of silicon for wafers of semiconductor devices. Another material that may be used in semiconductor device is gallium nitride (GaN). GaN is most typically formed by epitaxially growing a layer of the GaN on a substrate. For example, the substrate may be a layer of silicon. Growing the GaN, however, can cause defects in the GaN due to the different material characteristics between the GaN and the substrate (e.g., silicon substrate layer).

DETAILED DESCRIPTION OF THE EMBODIMENTS

A solution proposed for reducing defects in a semiconductor layer includes annealing the semiconductor layer with focused energy after the semiconductor layer is isolated from a substrate. This approach beneficially improves, among other things, the breakdown voltage of the semiconductor layer by increasing the ability of the semiconductor layer to propagate electric signals and conduct electric currents.

Figure 1:
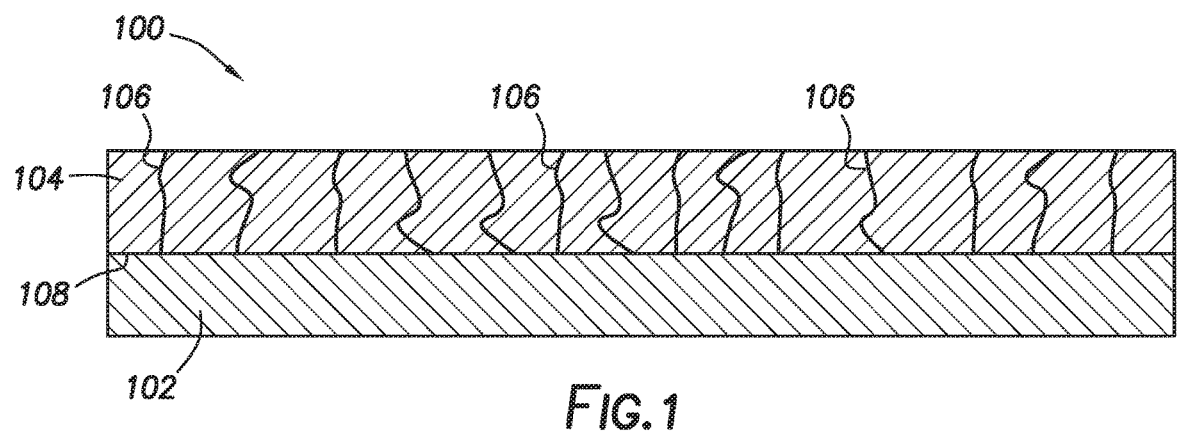
FIG. 1 is a cross-sectional schematic side view of an embodiment of a semiconductor wafer with a layer of GaN.

Turning now to the figures, FIG. 1 is a cross-sectional schematic side view of an embodiment of a wafer 100. The wafer 100 includes a substrate layer 102 and an epitaxial semiconductor layer 104 such as gallium nitride (GaN). The wafer 100 may be any size and configuration, such as 6 and 8 inch diameter wafers used in semiconductor fabrication. The scale of the thickness to the diameter of the wafer is not necessarily to scale in FIG. 1. The substrate 102, for example, may include a silicon layer that is 1 to 100 microns thick. The substrate 102 is formed by any known methods such as purifying a silicon ingot and slicing to produce a wafer forming the substrate layer 102.

After the substrate layer 102 is provided, the semiconductor layer 104 may be epitaxially grown on the substrate 102. For example, a material may be grown at a rate of one micron per hour to a total thickness between 0.1 microns and 20 microns. Alternatively, the semiconductor layer 104 may be added to the substrate 102 by other methods. The thickness of the semiconductor layer 104 enables a breakdown voltage from a few volts for thin layers, to thousands of volts for thicker layers. The material of the semiconductor layer 104, in certain embodiments, may include GaN, but may also include aluminum gallium nitride, silicon carbide, gallium arsenide, diamond, gallium oxide and similar compositions on a silicon substrate, or may include these or other compositions on a germanium substrate or other substrate materials. The semiconductor layer 104 may include additional layers made from different materials such as aluminum nitride (AlN), silicon nitride, silicon oxide, or any combinations thereof.

When the semiconductor layer 104 is grown and/or formed on a face 108 of the substrate 102, differences in the crystalline characteristics between the semiconductor layer 104 and the substrate 102 may produce defects 106. For example, in embodiments where the substrate 102 is silicon and the semiconductor layer 104 is GaN, the differences in the crystal lattice structure can cause defects 106. That is, a larger lattice structure of silicon causes the face 108 to have small variations that do not match the crystal lattice structure of GaN. Thus, to grow GaN on the face 108 of silicon, the atoms of the GaN are forced into configurations that do not match the natural crystal lattice structure of pure GaN. Furthermore, differences in the thermal coefficients of expansion can also contribute to producing defects 106. The GaN is typically grown on the silicon at an elevated temperature relative to typical atmospheric temperatures, and then treated at lower temperatures. When the layers 102, 104 expand and contract, the substrate 102 may expand or contract more than the semiconductor layer 104. This may compress the semiconductor layer 104, which further exacerbates the production of defects 106.

The defects 106 in the semiconductor layer 104 are small, but may be plentiful over the whole of the semiconductor layer 104. The defects 106 individually do not prevent signal flow through the semiconductor layer 104, but cumulatively the defects 106 can contribute to power loss or other problems in circuits utilizing the semiconductor layer 104 in a semiconductor device. Reducing the number and/or significance of the defects 106 can contribute to better signal and current flow through the semiconductor layer 104, and in certain embodiments can contribute to an increase in the growth rate of the semiconductor layer 104 in subsequent growth operations, as explained below.

Figure 2:
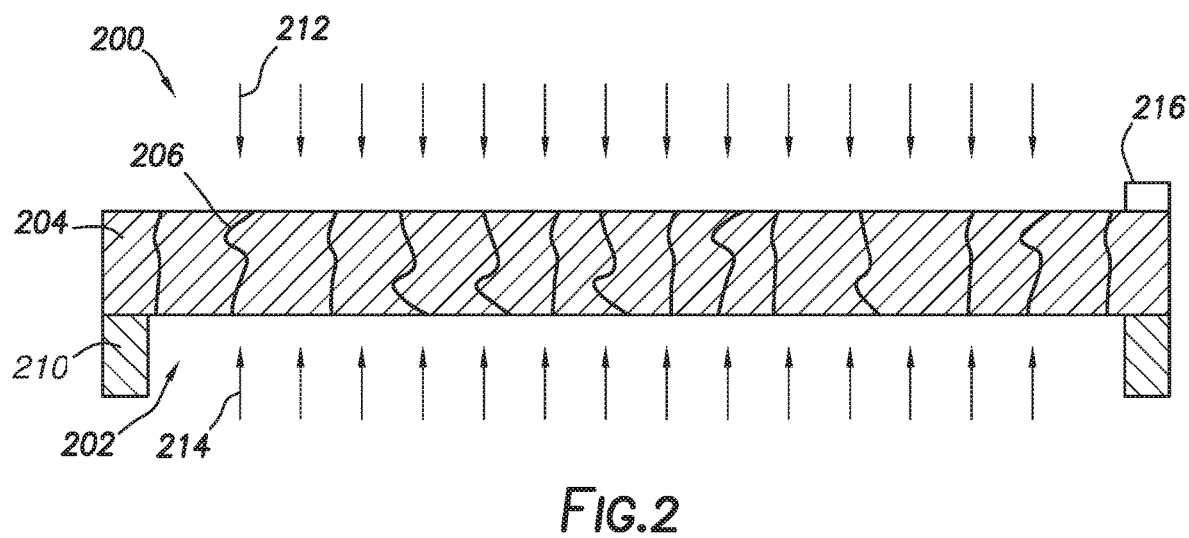
FIG. 2 is a cross-sectional schematic side view of an embodiment of a semiconductor wafer illustrating an annealing process for reducing defects in a GaN layer.

FIG. 2 is a schematic cross-sectional side view of an embodiment of a wafer 200 that a semiconductor layer 204 that has defects 206 formed as described above and has a substrate layer 202, part of which is removed from below the semiconductor layer 204, leaving only a support ring 210 behind. Alternatively, the substrate layer 202 may be entirely removed, or may have a pattern left behind. The support ring 210 may encompass the entire circumference of the wafer 200 to strengthen the wafer 200 during transport and treatment of the wafer 200. The substrate layer 202 may be removed by a combination of mechanical and chemical techniques. For example, the Taiko process may be used to grind away at least a portion of the substrate layer 202. Any remaining portion of the substrate layer 202 may be removed using a chemical wash. Specifically, a fluid chemical such as an acid etch that stops at etching when contacting the GaN/semiconductor layer 204, leaving the GaN substantially intact or unetched.

Once all or a portion of the substrate layer 202 is removed from beneath the semiconductor layer 204, the wafer 200 is then subjected to focused energy 212 from the top of the semiconductor layer 204, or focused energy 214 from the bottom of the semiconductor layer 204, or any combination thereof. The focused energy 212, 214 is used to anneal the semiconductor layer 204 and reduce the defects 206. The reduction of the defects 206 may be a result of heating of the semiconductor layer 204, which softens the semiconductor layer 204 and fuses (e.g., annihilates) the defects 206. This allows the defects 206 to be reduced with the causes of the defects 206 (e.g., crystal lattice mismatch and thermal discrepancy) absent during the annealing step. The semiconductor layer 204 may be supported by a support structure during the annealing process, particularly in embodiments where large sections of the semiconductor layer 204 are annealed at one time. That is, the semiconductor layer 204 can be softened enough during the annealing procedure that the support structure is necessary to prevent sagging or other deformation of the semiconductor layer 204.

The focused energy of the annealing process may include laser light in a wide range of wavelengths/frequencies. For example, the annealing may be completed using a short-wavelength laser. Other wavelengths of laser light may also be used. The laser may be focused on selected areas of the semiconductor layer 204 and/or masked 216 from other areas to increase the effectiveness of the annealing in the selected areas or other purposes.

Figure 3:
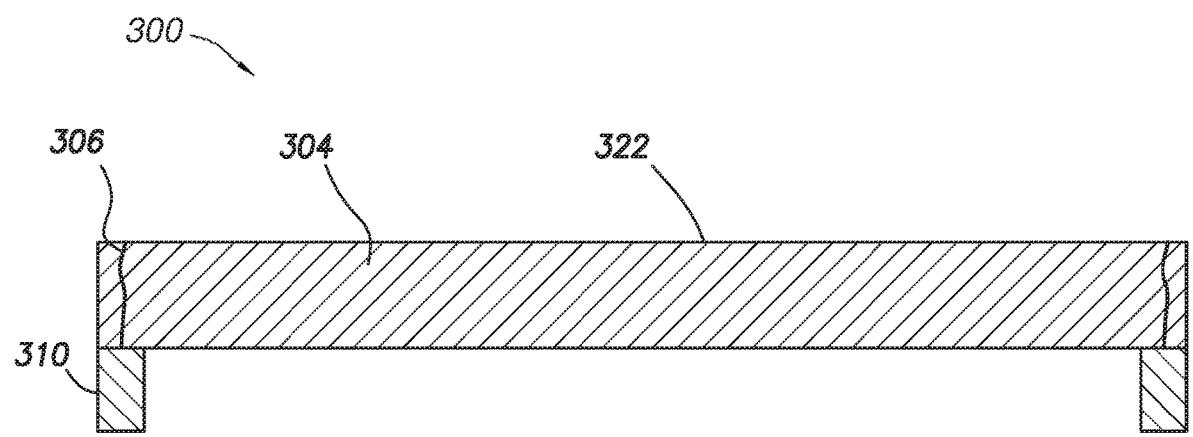
FIG. 3 is a cross-sectional schematic side view of an embodiment of a semiconductor wafer illustrating reduced defects in a GaN layer.

FIG. 3 is a cross-sectional schematic side view of an embodiment of a semiconductor wafer 300 illustrating reduced defects 306 in a semiconductor layer 304 as well as a support ring 310. The semiconductor layer 304 may include some defects 306, but after the annealing process illustrated in FIG. 2, the defects 306 are significantly reduced. For example, a semiconductor layer 304 made of any combination of GaN or Si may have $10^9$ threading dislocations (defects) per $cm^2$. The treatment disclosed in the embodiments here can reduce the dislocations and/or defects down to $10^7$ per $cm^2$. Such a reduction significantly improves device performance, reliability, and cost due to the reduced resistance in the semiconductor layer 304, and the increased homogeneity. The reduction in defects 306 makes the semiconductor layer 304 able to handle from twenty-five percent higher voltage signals to several hundred percent higher voltage signals without power loss as compared to the same semiconductor layer 204 with the defects 206 before the annealing process. For example, the breakdown voltage of semiconductors using the annealed semiconductor layer 304 may double, or alternatively, the semiconductor layer 304 may require half the thickness to achieve the breakdown voltage. The quality of the crystal is improved, enabling improved electrical performance (lower resistance, reduction of dynamic effects, high system efficiency), reliability, and wafer yield. Furthermore, because the defects 306 have been reduced, the semiconductor layer 304 may be subjected to further growth at an increased rate. That is, such as a top surface 322 of the semiconductor layer 304 is more amenable to receiving epitaxial growth. The growth therefore, may be fifty percent to one thousand percent faster after the annealing process is completed. Further growth may also be formed at the bottom of the semiconductor, preferably by placing the growth surface facing the incoming growth elements.

Figure 4:
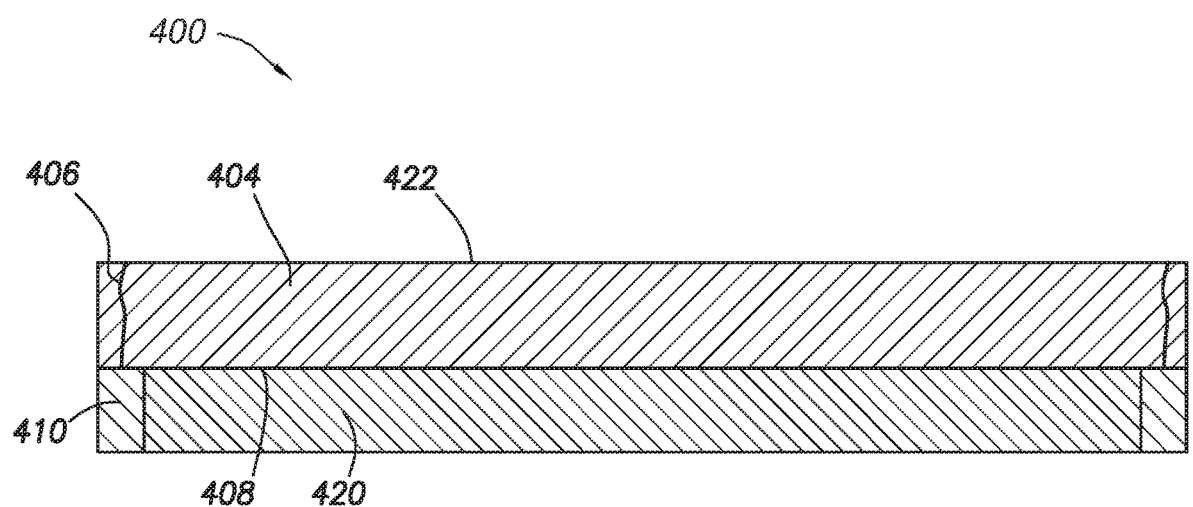
FIG. 4 is a cross-sectional schematic side view of an embodiment of a semiconductor wafer illustrating a filler under the GaN.

As illustrated in FIG. 4, one or more embodiments of the semiconductor wafer 400 may include a replaced substrate layer 420 within a support ring 410. Since a semiconductor layer 404 has already been subjected to annealing, defects 406 have been reduced, and any differences present at a face 408 of the semiconductor layer 404 do not cause further defects 406. Furthermore, because the defects 406 have been reduced, the semiconductor layer 404 may be subjected to further growth at an increased rate. That is, a top surface 422 of the semiconductor layer 404 is more amenable to receiving epitaxial growth. The growth therefore, may be ten times faster after the annealing process is completed.

Alternatively, another embodiment of using a supporting element may be used prior to annealing. This supporting element is selected such that it does not pose the same lattice and thermal mismatch as the Si substrate. Example is bonding to an engineered substrate, or Si oxide layer atop a Si substrate. Si oxide is an amorphous material that does not form the same lattice stress posed by a crystalline Si substrate. Supporting elements may include alloys of such materials as polysilicon, AlN, Al oxide, SiC and the like. Depending of the type of supporting element it will be kept for further device fabrication and assembly, or removed at a desired step of the fabrication process.

Figure 5:
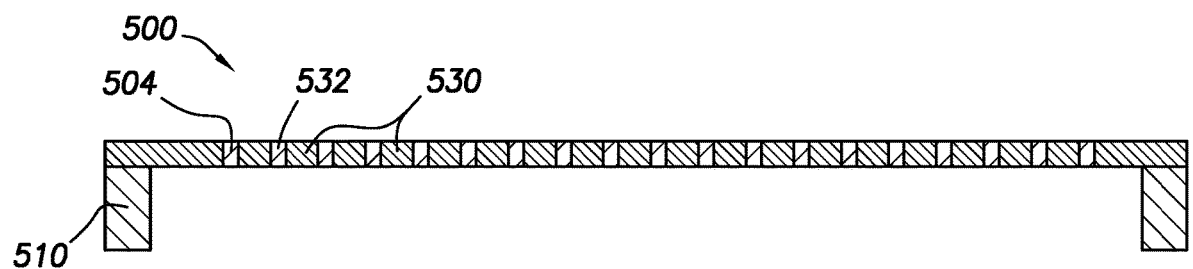
FIG. 5 is a cross-sectional schematic side view of an embodiment of a semiconductor wafer illustrating isolation of discrete semiconductor devices.

FIG. 5 is a cross-sectional schematic side view of an embodiment of a semiconductor wafer 500 illustrating isolation of discrete semiconductor devices 530. The isolation of the semiconductor devices 530 on the semiconductor layer 504 supported by a support ring 510 is possible after the semiconductor layer 504 has been separated from any substrate. The isolation of the semiconductor devices 530 is an electrical isolation, for example by nitrogen implantation, wherein the semiconductor layer 504 is periodically converted into insulating stripes 532.

Figure 6:
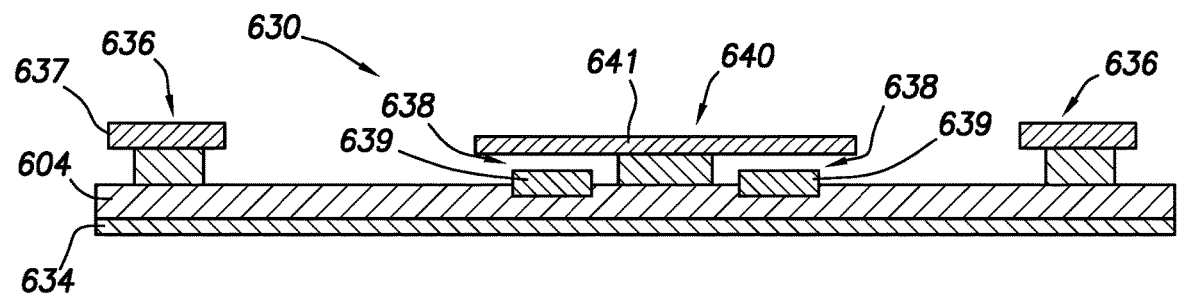
FIG. 6 is a cross-sectional schematic side view of an embodiment of a semiconductor device illustrating an annealed GaN layer backed by a back metal.
Figure 7:
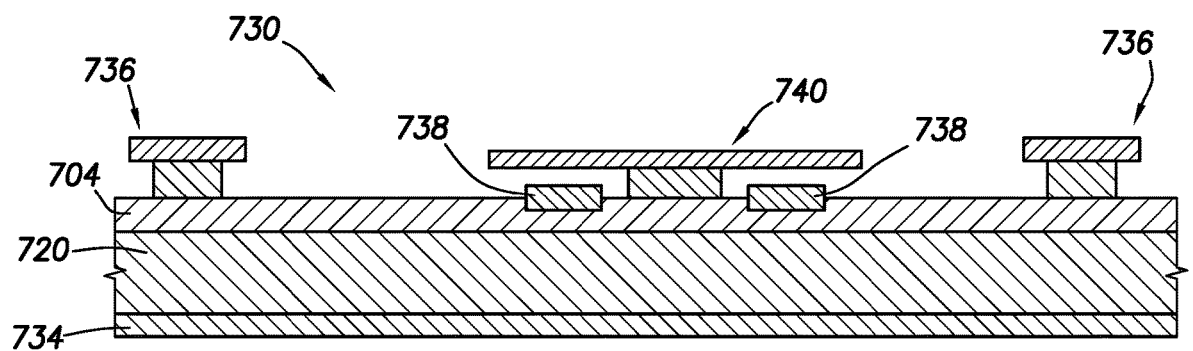
FIG. 7 is a cross-sectional schematic side view of an embodiment of a semiconductor device illustrating an annealed GaN layer backed by a back metal and a filler substrate.

FIG. 6 is a cross-sectional schematic side view of an embodiment of a semiconductor device 630 that may be located on the semiconductor layers 104, 204, 304, 404, 504 described above. The device 630 includes a back metal 634, a drain 636 connected to a drain electrode 637, a gate 638 connected to a gate electrode 639, and a source 640 connected to a source electrode 641. The semiconductor layer 604 is annealed as described above, and is therefore better able to pass signals, and electric current, between the drain 636 and the source 640. The back metal 634 may be directly on the back of the semiconductor layer 604. In a different embodiment illustrated in FIG. 7, a semiconductor device 730 includes a substrate layer 720 between signal components (i.e., drain 736, gate 738, and source 740) and back metal 734 and also includes a semiconductor layer 704. The signal components 636/736, 638/738, 640/740 may be located, as shown, with a source 640/740 in a central location flanked by gates 638/738 and drains 636/736, or alternatively, gates and drains may be located in a different configuration. For example, the semiconductor device 730 may be a vertical trench configuration, or an alternative lateral configuration.

Figure 8:
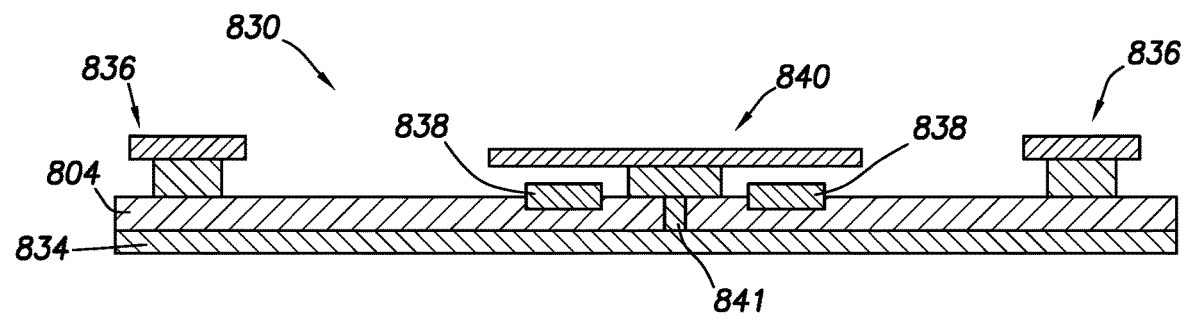
FIG. 8 is a cross-sectional schematic side view of an embodiment of a semiconductor device illustrating an annealed GaN layer backed by a back metal and a backside source.
Figure 9:
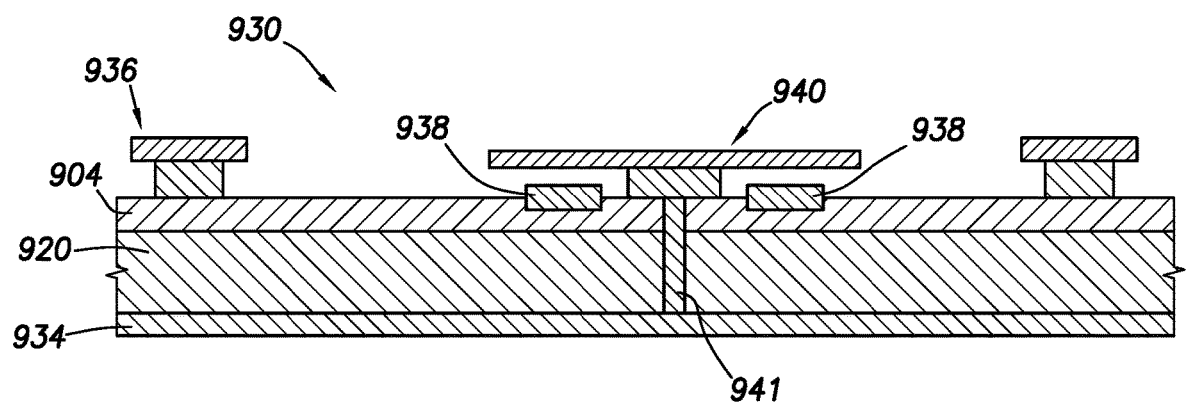
FIG. 9 is a cross-sectional schematic side view of an embodiment of a semiconductor device illustrating an annealed GaN layer backed by a back metal with a backside source and a filled-in substrate.
Figure 10:
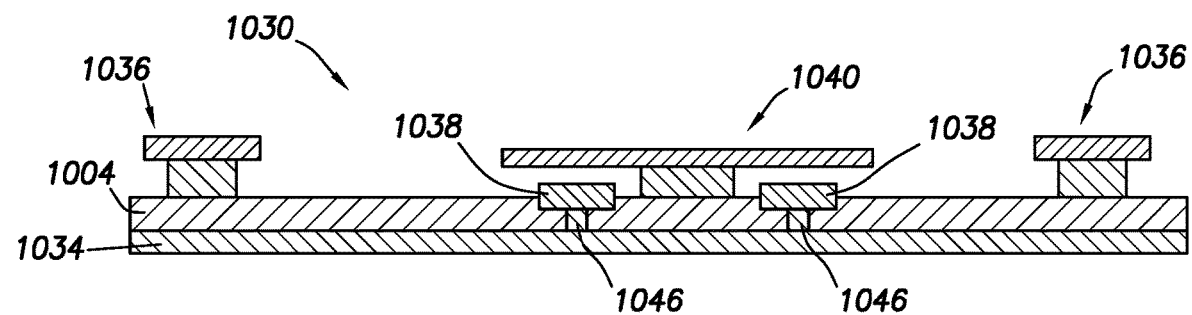
FIG. 10 is a cross-sectional schematic side view of an embodiment of a semiconductor device illustrating an annealed GaN layer backed by a back metal and a backside gate electrode.

FIG. 8 is a cross-sectional schematic side view of an embodiment of a semiconductor device 830 illustrating a semiconductor layer 804 with a source electrode 841 connected to back metal 834 rather than an electrode on the front of the semiconductor device 830. A drain 836, a gate 838, and a source 840 may otherwise be located in conventional locations, but the source electrode 841 located through the semiconductor layer 804 enables more compact circuitry in fabricating the semiconductor device 830. As illustrated in FIG. 9, a source electrode 941 of a semiconductor device 930 may also pass through a substrate layer 920 that has been fabricated between a semiconductor layer 904 and a back metal 934. The source electrode passing through the semiconductor is preferably formed by a metallized via that is electrically isolated by insulating material at its sidewalls. The semiconductor device 930 may have a drain 936, gate 938, and source 940 located as shown. Alternatively, the semiconductor device 930 may include other configurations of the drain 936, gate 938, and source 940. FIG. 10 is a cross-sectional schematic side view of an embodiment of a semiconductor device 1030 illustrating a semiconductor layer 1004 with gate electrodes 1046 connected to a back metal 1034. The semiconductor device 1030 may have a drain 1036, gate 1038, and source 1040 located as shown. Alternatively, the semiconductor device 1030 may include other configurations of the drain 1036, gate 1038, and source 1040, such as the drain is entrained and insulated to be at the bottom the device.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A semiconductor device, comprising:
    a semiconductor layer comprising a gallium nitride (GaN) layer or an aluminum-GaN layer, within which structural defects caused by growing the semiconductor layer on a substrate are reduced throughout the entire thickness of the semiconductor layer as a result of annealing by focused energy with at least some of the substrate removed;
    a back metal directly contacting and supporting the semiconductor layer;
    a drain coupled to a first surface of the semiconductor layer and connected to a first electrode; and
    a source coupled to the semiconductor layer and connected to a second electrode on a second surface opposite the first surface of the semiconductor layer;
    a gate coupled to the first surface of the semiconductor layer; and
    wherein the drain, source, and gate are isolated from each other and provide a transistor device structure.

2. The semiconductor device of claim 1, wherein the semiconductor layer comprises a thickness of 0.1 to 20 µm to enable breakdown voltage from a few volts to thousands of volts.

3. The semiconductor device of claim 1, wherein the semiconductor layer comprises aluminum-GaN and the aluminum percentage is between five and fifty percent.

4. The semiconductor device of claim 1, wherein the semiconductor layer comprises annealed GaN.

5. The semiconductor device of claim 1, wherein the semiconductor layer further comprises a top surface more amenable to receiving epitaxial growth as a result of the annealing by focused energy.

6. The semiconductor device of claim 1, wherein the semiconductor device further comprises additional GaN or aluminum GaN grown on the semiconductor layer after the annealing by focused energy.

7. The semiconductor device of claim 6, wherein the semiconductor layer comprises un-annealed GaN in addition to the annealed GaN.

8. The semiconductor device of claim 1, wherein:
    the structural defects caused by growing the semiconductor layer on the substrate are reduced throughout the entire thickness of the semiconductor layer as a result of annealing by focused energy with all of the substrate removed; and
    the back metal is directly contacting and supporting the entire semiconductor layer.

* * * * *